United States Patent
Schröder et al.

(10) Patent No.: US 6,853,214 B2
(45) Date of Patent: Feb. 8, 2005

(54) CIRCUIT CONFIGURATION FOR CONTROLLING LOAD-DEPENDENT DRIVER STRENGTHS

(75) Inventors: Stephan Schröder, München (DE); Joerg Vollrath, Olching (DE)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 10/619,014

(22) Filed: Jul. 11, 2003

(65) Prior Publication Data

US 2004/0012438 A1 Jan. 22, 2004

(30) Foreign Application Priority Data

Jul. 11, 2002 (DE) .......................................... 102 31 433

(51) Int. Cl.[7] .......................................... H03K 19/003
(52) U.S. Cl. .............................. 326/31; 326/33; 326/83
(58) Field of Search .............................. 326/30–34, 83; 327/108, 109

(56) References Cited

U.S. PATENT DOCUMENTS

| | | | |
|---|---|---|---|
| 5,621,335 A | 4/1997 | Andresen | 326/30 |
| 6,097,219 A | 8/2000 | Urata et al. | 326/83 |
| 6,346,830 B1 * | 2/2002 | Ishikawa | 326/93 |
| 6,753,703 B2 * | 6/2004 | Chu | 326/126 |

* cited by examiner

Primary Examiner—James H. Cho
(74) Attorney, Agent, or Firm—Laurence A. Greenberg; Werner H. Stemer; Gregory L. Mayback

(57) ABSTRACT

A circuit configuration has a first driver stage for feeding in an input signal and for outputting an amplified signal. A second driver stage, which is connected in parallel with the first driver stage, is fed, on the input side, both the input signal and a control signal from a reference circuit connected upstream. The reference circuit compares the feedback level of an output signal, which level is present at one of its inputs, with the level of the input signal present at its other input and generates the control signal for driving the driver stage in the event that the level of the output signal is lower than the level of the input signal. As a result, the driver stage is connected for additional amplification of the input signal.

9 Claims, 3 Drawing Sheets

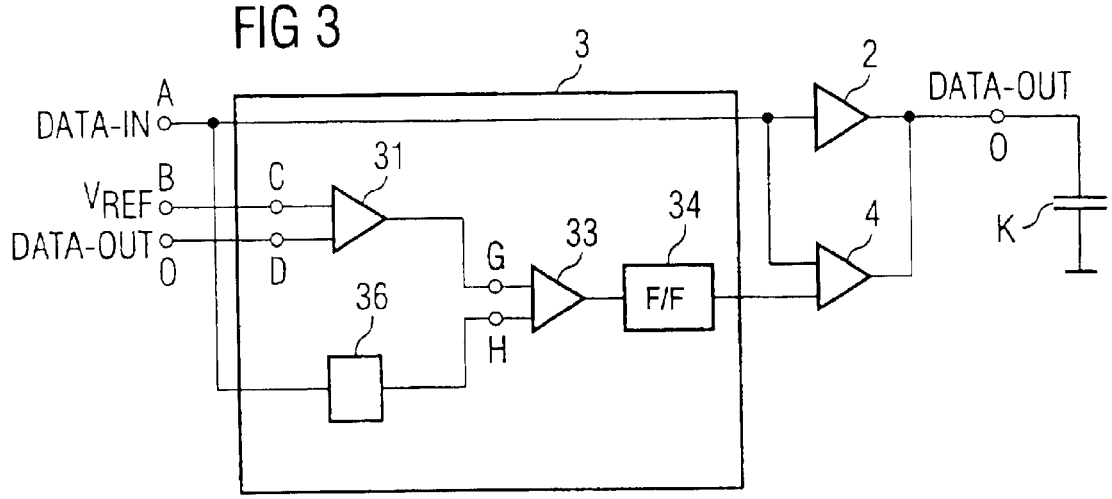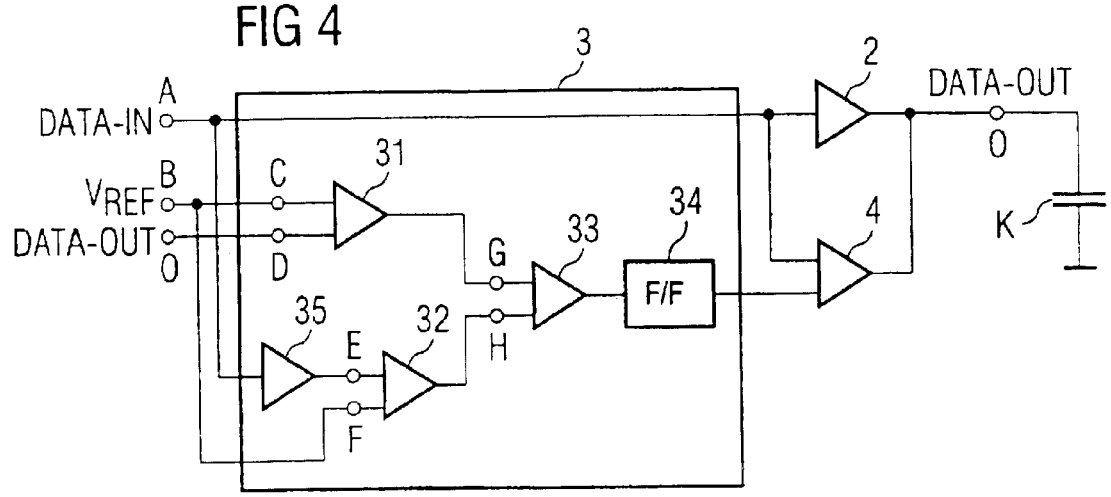

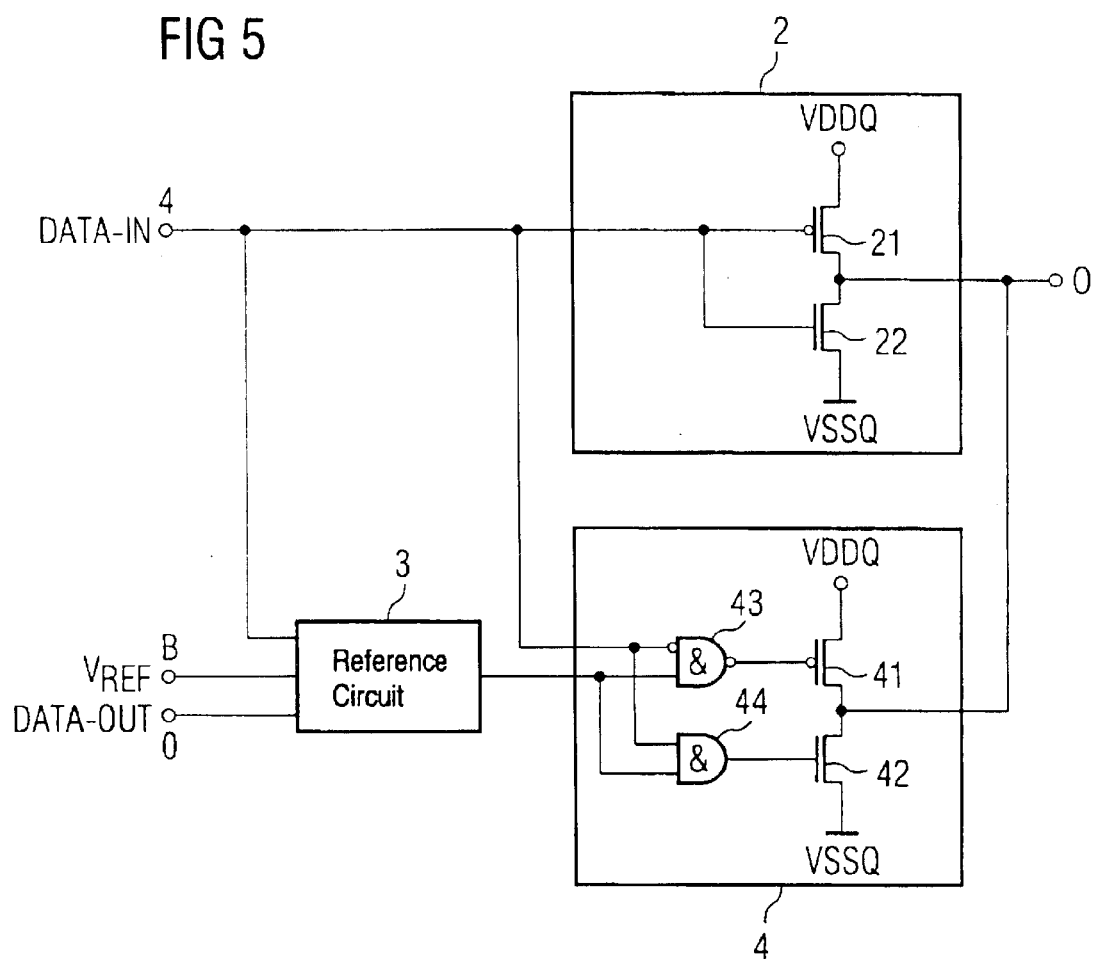

CIRCUIT CONFIGURATION FOR CONTROLLING LOAD-DEPENDENT DRIVER STRENGTHS

BACKGROUND OF THE INVENTION

Field of the Invention

The invention relates to a circuit configuration for controlling load-dependent driver strengths.

In order to increase the data throughput, integrated circuits, especially SDRAM or DDR-DRAM memories, are operated with increasing processing speeds and higher transfer frequencies. The data are transferred to the downstream peripherals via high-speed transfer links. High transfer frequencies, in particular, lead to increased distortion, interference and disturbance of the signals to be transferred and impair the signal quality and detectability. Depending on the peripherals connected to the signal lines, different load behaviors result at the output drivers of a memory chip and substantially influence the output time behavior of the data to be transferred. The signals are transferred in a delayed manner in the case of a large output load, and, moreover, the signal characteristics, such as the steepness of rising and falling edges, for example, are altered or distorted.

An input signal applied to an amplifier stage is amplified by a specific factor. Hitherto, only in the production process has it been possible to set and alter the driver strength of an amplifier stage and the number of switched-on amplifier stages of a circuit configuration. For a correspondingly required output power of an amplifier stage, the gain factor is determined depending on manufacturing tolerances and component specifications in the manufacturing process. In addition, the driver strength can be set in the manufacturing process by the connection or disconnection of field-effect transistors connected in parallel. This is done by connection or disconnection of interconnect runs and can no longer be altered after the conclusion of the manufacturing process. Consequently, the gain factor of an amplifier stage is fixedly predetermined. The amplifier stages to be found in the integrated circuits do not enable requirement-conforming setting of the driver strength in order to adapt signal characteristics and throughput speeds on the basis of load conditions present at the transfer points, the so-called pads.

U.S. Pat. No. 6,097,219 describes an output driver for automatically controlling a load-dependent driver strength, which has a first driver stage and at least one further driver stage connected in parallel with the first driver stage. The connection of the further driver stage is controlled in a manner dependent on the result of a phase comparison—carried out by a reference circuit—of an input signal and an output signal of the first driver stage.

U.S. Pat. No. 5,621,335 discloses a circuit configuration for carrying out a phase comparison between an output signal and a delayed input signal of a driver stage, the driver strength or the speed of the driver stage being set in a manner dependent on the phase shift of the signals.

SUMMARY OF THE INVENTION

It is accordingly an object of the invention to provide a circuit configuration for controlling load-dependent driver strengths that overcomes the above-mentioned disadvantages of the prior art devices of this general type, which is suitable as a load-dependent amplifier stage for adapting a signal to the load conditions in such a way that the signal quality is improved.

With the foregoing and other objects in view there is provided, in accordance with the invention, a circuit configuration for controlling load-dependent driver strengths. The circuit configuration contains an input terminal for feeding in an input signal, an output terminal for tapping off an amplified signal, and a first amplifier stage having an input connected to the input terminal for feeding in the input signal and, an output connected to the output terminal for outputting the amplified signal. A reference circuit receives the input signal, the amplified signal and a reference voltage, and performs a phase comparison between the input signal and the amplified signal. The reference circuit contains a differential amplifier with at least two input terminals receiving the amplified signal and the reference voltage, and outputs a differential output signal. The reference circuit includes a logic combination element having a first input receiving the input signal, a second input receiving the differential output signal of the differential amplifier, and an output. Furthermore, the reference circuit contains a flip-flop having an input connected to the output of the logic combination element and an output outputting a reference output signal. A second amplifier stage is connected to the output of the flip-flop and has inputs receiving the reference output signal from the reference circuit and the input signal. The second amplifier stage further has an output connected in parallel with the output of the first amplifier stage, and the second amplifier stage switches on in a manner dependent on the reference output signal generated by the reference circuit.

The object is achieved according to the invention by a reference circuit having a first differential amplifier with at least two input terminals, to which the output signal and the reference voltage are fed on the input side, a logic combination element, which is driven by the input signal at a first input and the output signal of the first differential amplifier at a second input, and a flip-flop, which is connected downstream of the logic combination element and serves for driving the second amplifier stage connected downstream.

The circuit configuration according to the invention makes it possible for at least one further, second amplifier stage to be connected in parallel with at least one first amplifier stage, which amplifies an input signal present, in a manner dependent on the voltage potential present at the output of the first amplifier stage, on the basis of a control signal generated by the reference circuit. The reference circuit uses a differential amplifier to which the output signal is fed back and which compares the voltage potential of the output signal of an amplifier stage with a reference voltage. The output signal of the differential amplifier is forwarded to a logic combination element to which the input signal is also fed in a delayed manner. If the output signal of the differential amplifier is present in a delayed manner with respect to the input signal at the combination element, then, via the combination element, an RS flip-flop is set and a second amplifier stage driven by the latter is activated. The second amplifier stage is connected in parallel with the first amplifier stage and effects further amplification of the signal. Switching on can be effected for example by a control signal of the reference circuit with a rising edge, which is applied to the second amplifier stage. The switched-on amplifier stages forward the signals in amplified fashion via interconnects to the pads of downstream peripherals.

Depending on the load to be driven that is connected to the pad, the steepness of the signal edges of the output signals changes and, consequently, the data have hitherto been driven out of the amplifier stage in a delayed manner in the case of a large connected load. This disadvantage is eliminated by the circuit configuration according to the invention.

Since the operating mode of the memory is configured during the start-up of a system, the read commands initiated in the first initialization phase can effect a setting of the driver strength of an input/output unit in a manner dependent on the connected load. Further adaptations during operation for setting the driver strength to altered load conditions can be performed at any time.

The circuit configuration has the advantage of optimizing the temporal forwarding of the signals in a manner dependent on the load connected to the connection points, thereby avoiding load-dependent data transfer delays to the greatest possible extent. The driver strength of an amplifier stage is set in a load-dependent manner, so that the data throughput can be significantly increased on account of improved output signal quality.

In accordance with an added feature of the invention, the differential amplifier compares the reference voltage with a voltage of the amplified signal and has an output outputting the differential output signal. The logic combination element compares levels present at the first and second inputs with one another, so that, for a case where a signal with a lower level is present at the second input and a signal with a higher level is present at the first input, a signal with a high level is generated at the output for driving the flip-flop. The flip-flop is set in an event of a signal with a high level being present at the input of the flip-flop and drives the second amplifier stage connected downstream, with a result that the second amplifier stage is switched-on in parallel with the first amplifier stage.

In accordance with a further feature of the invention, the second amplifier stage, in an event of being switched-on, effects additional amplification of the input signal.

In accordance with an additional feature of the invention, the input signal is fed to the logic combination element in a delayed manner.

In accordance with another feature of the invention, the reference circuit further has an additional amplifier stage and a further differential amplifier connected between the additional amplifier stage and the logic combination element. The input signal is fed to the logic combination element through the additional amplifier stage and the further differential amplifier. The additional amplifier stage outputs an output signal, and the further differential amplifier has a first input receiving the output signal from the additional amplifier stage and a second input receiving the reference voltage. The further differential amplifier has an output and compares the reference voltage with a voltage of the output signal of the additional amplifier stage and outputs a further amplified signal at the output of the further differential amplifier stage.

Other features which are considered as characteristic for the invention are set forth in the appended claims.

Although the invention is illustrated and described herein as embodied in a circuit configuration for controlling load-dependent driver strengths, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a circuit block diagram of an exemplary embodiment of the circuit configuration according to the invention;

FIG. 4 is a circuit block diagram of a further exemplary embodiment of the circuit configuration according to the invention; and FIG. 5 is a circuit diagram of an exemplary embodiment of an amplifier stage controlled via a reference circuit.

DESCRIPTION OF THE PREFERRED EMBODIMENTS

Figure 1:
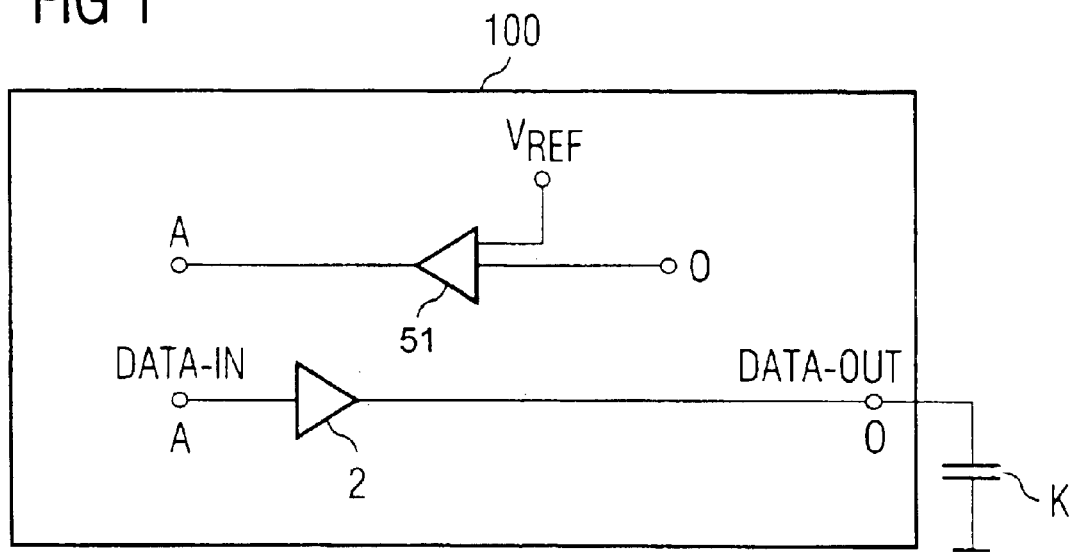
FIG. 1 is a circuit block diagram of an input/output unit of a memory chip.

Referring now to the figures of the drawing in detail and first, particularly, to FIG. 1 thereof, there is shown a block diagram of an input/output unit 100 of a memory chip. The input and output unit 100 is of a bi-directional configuration. Via a terminal point A, data are forwarded from a memory via an amplifier stage 2 to peripherals connected to an output terminal O, the peripherals being represented by a load K thereof. Data to be stored in the memory chip are fed to a differential amplifier 51 and forwarded to the memory chip via the terminal A.

Figure 2:
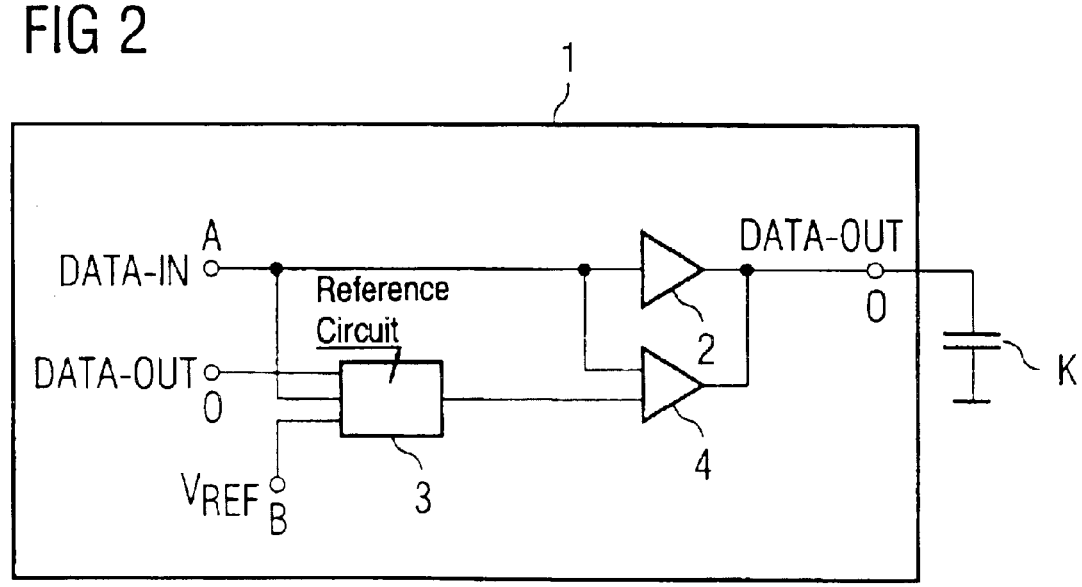
FIG. 2 is a circuit block diagram of a circuit configuration according to the invention.

A circuit configuration according to the invention is illustrated in a block diagram in FIG. 2. The amplifier stage 2 is connected to the input terminal A on the input side and to the output terminal O on the output side. A signal DATA-IN to be amplified is present at the input terminal A and is fed to the amplifier stage 2, which performs amplification of the input signal DATA-IN. The input signal DATA-IN is likewise fed to an input of an amplifier stage 4 connected in parallel with the amplifier stage 2. A reference circuit 3 is connected to the input terminal A and a terminal B, at which the reference potential VREF is present. The reference circuit 3 is fed an output signal DATA-OUT from the output terminal O. The reference circuit 3 performs a phase comparison of the signals DATA-OUT and DATA-IN. A greater or lesser delay of the output signal DATA-OUT with respect to the input signal DATA-IN results depending on the external load K. If the delay exceeds a value that is preset in the reference circuit 3, the reference circuit 3 generates a control signal which is applied to a further input of the amplifier stage 4 connected downstream, so that the latter is switched on and is thus connected in parallel with the amplifier stage 2 and performs additional amplification of the input signal DATA-IN.

FIG. 3 shows a more detailed exemplary embodiment of the circuit configuration 1 with regard to the reference circuit 3. A differential amplifier 31 is connected by its input terminals C, D to the input terminals B and O for feeding in the signal DATA-OUT and the reference voltage VREF. The differential amplifier 31 compares the reference voltage VREF with the voltage of the output signal DATA-OUT. The amplified output signal of the differential amplifier 31 is fed to an input G of a logic combination element 33 connected downstream of the differential amplifier 31. The delayed input signal DATA-IN is fed to an input H of the logic combination element 33 via a delay element 36. The logic combination element 33 compares the levels present at its inputs with one another. If the load present at the output terminal O exceeds a specific capacitance, then the level of the output signal DATA-OUT is lower than the level of the input signal DATA-IN and the data are driven in a significantly delayed manner.

The combination element 33 thus generates a signal, e.g. a logic "1", so that a flip-flop 34 connected downstream is set. If the flip-flop 34 is set, the amplifier stage 4 connected downstream of the flip-flop 34 is switched on, is connected in parallel with the amplifier stage 2 and performs additional amplification of the input signal DATA-IN.

FIG. 4 shows an example of the circuit configuration 1 according to the invention with regard to a further embodiment of the reference circuit 3. The input signal DATA-IN is fed to an input of a further amplifier stage 35 and applied as an amplified signal to an input terminal E of a differential amplifier 32 connected downstream. The reference voltage VREF is present at the input F of the differential amplifier 35. The differential amplifier 32 compares the reference voltage VREF with the voltage of the output signal DATA-OUT. The amplified output signal of the differential amplifier 32 is fed to the logic combination element 33 via its input H. The logic combination element 33 compares the levels present at its inputs with one another and generates, as described above in FIG. 3, a signal in the event of a lower level of the output signal DATA-OUT, with the result that the flip-flop 34 connected downstream is set. If the flip-flop 34 is set, the amplifier stage 4 connected downstream of the flip-flop 34 is switched on, is connected in parallel with the amplifier stage 2 and performs additional amplification of the input signal DATA-IN.

A possible embodiment of an output driver containing the two amplifier stages 2 and 4 is embodied in FIG. 5. The two amplifier stages 2 and 4 are connected in parallel at their inputs and outputs. The amplifier stages 2 and 4 have complementary field-effect transistors 21, 22 and 41, 42 of a p-channel type and an n-channel type that are connected in series. The p-channel field-effect transistors 21 and 41 are connected to a voltage potential VDDQ via their source terminals and the n-channel field-effect transistors 22 and 42 are connected to the reference-ground potential VSSQ via their source terminals. The coupling points of the drain terminals of the field-effect transistors 21, 22 and 41, 42 are connected in parallel and serve as the output of the amplifier stage.

The input signal DATA-IN is fed to the series circuit of the field-effect transistors 21 and 22 directly, to the p-channel field-effect transistor 41 via a logic NAND gate 43, and to the n-channel field-effect transistor 42 via an AND gate 44. The input signal DATA-IN is inverted at an input of the NAND gate 43. The further inputs of the logic combination elements 43 and 44 are connected to the reference circuit 3 for receiving a control signal.

In order to simplify the explanations below, rising edges are designated by logic "1" and falling edges by logic "0".

The p-channel field-effect transistors 21 and 41 turn on if a logic "0" is present at their gate terminals; they turn off if a logic "1" is present at their gate terminals. The n-channel field-effect transistors 22 and 42 turn on if a logic "1" is present at their gate terminals; they turn off if a logic "0" is present at their gate terminals.

As already described in the explanations of FIG. 2, the reference circuit 3 generates the control signal for driving the gate terminals of the field-effect transistors 41 and 42.

The input signal DATA-IN and the control signal generated by the reference circuit 3 are fed to the inputs of the logic combination elements 43 and 44.

If the input signal DATA-IN has a logic "1", then a logic "1" is present at the gate terminals of the field-effect transistors 21 and 22, so that the field-effect transistor 22 turns on. If the input signal DATA-IN has a logic "0", then a logic "0" is present at the gate terminals of the field-effect transistors 21 and 22, so that the field-effect transistor 21 turns on.

An input signal DATA-IN with a logic "1" is inverted to form a logic "0" at the input of the NAND gate 43. If the control signal of the reference circuit 3 that is fed to the NAND gate 43 has a logic "0" or a logic "1", then the combination of the NAND gate 43 produces a logic "1" at the output and the field-effect transistor 41 turns off. A logic "0" is present at the input of the field-effect transistor 41 only when the input signal DATA-IN has a logic "0" and the control signal has a logic "1" so that the transistor turns on and effects additional amplification of the input signal DATA-IN.

The combination of the signals fed to the AND gate 44 produces a logic "1" at its output only for the case where both the input signal DATA-IN and the control signal of the reference circuit 3 have a logic "1", so that the field-effect transistor 42 turns on and effects additional amplification of the input signal DATA-IN.

The output signal DATA-OUT is output via the output terminal O to the metallic pads situated in the topmost metallization plane of the semiconductor chip. Contact is made between the pads and the terminal pins of the housing via bonding wires.

We claim:

1. A circuit configuration for controlling load-dependent driver strengths, comprising:
    an input terminal for feeding in an input signal;
    an output terminal for tapping off an amplified signal;
    a first amplifier stage having an input connected to said input terminal for feeding in the input signal and, an output connected to said output terminal for outputting the amplified signal;
    a reference circuit receiving the input signal, the amplified signal and a reference voltage, and performing a phase comparison between the input signal and the amplified signal, said reference circuit containing:
        a differential amplifier with at least two input terminals receiving the amplified signal and the reference voltage, and outputting a differential output signal;
        a logic combination element having a first input receiving the input signal, a second input receiving the differential output signal of said differential amplifier, and an output; and
        a flip-flop having an input connected to said output of said logic combination element and an output outputting a reference output signal; and
    a second amplifier stage connected to said output of said flip-flop and having inputs receiving the reference output signal from said reference circuit and the input signal, said second amplifier stage further having an output connected in parallel with said output of said first amplifier stage, and said second amplifier stage switching on in a manner dependent on the reference output signal generated by said reference circuit.

2. The circuit configuration according to claim 1, wherein said differential amplifier compares the reference voltage with a voltage of the amplified signal and has an output outputting the differential output signal.

3. The circuit configuration according to claim 1, wherein said logic combination element compares levels present at said first and second inputs with one another, so that, for a case where a signal with a lower level is present at said second input and a signal with a higher level is present at said first input, a signal with a high level is generated at said output for driving said flip-flop.

4. The circuit configuration according to claim 1, wherein said flip-flop is set in an event of a signal with a high level being present at said input of said flip-flop and drives said second amplifier stage connected downstream, with a result that said second amplifier stage is switched-on in parallel with said first amplifier stage.

5. The circuit configuration according to claim 1, wherein said second amplifier stage, in an event of being switched-on, effects additional amplification of the input signal.

6. The circuit configuration according to claim 1, wherein the input signal is fed to said logic combination element in a delayed manner.

7. The circuit configuration according to claim 1, wherein said reference circuit further has an additional amplifier stage and a further differential amplifier connected between said additional amplifier stage and said logic combination element, the input signal being fed to said logic combination element through said additional amplifier stage and said further differential amplifier.

8. The circuit configuration according to claim 7, wherein:

said additional amplifier stage outputs an output signal; and said further differential amplifier has a first input receiving the output signal from said additional amplifier stage and a second input receiving the reference voltage.

9. The circuit configuration according to claim 8, wherein said further differential amplifier has an output and compares the reference voltage with a voltage of the output signal of said additional amplifier stage and outputs a further amplified signal at said output of said further differential amplifier stage.

* * * * *